(12) United States Patent
Mani

(10) Patent No.: US 12,141,515 B2
(45) Date of Patent: Nov. 12, 2024

(54) MEMORY CELL LAYOUT FOR LOW CURRENT FIELD-INDUCED MRAM

(71) Applicant: III HOLDINGS 1, LLC, Wilmington, DE (US)

(72) Inventor: Krishnakumar Mani, San Jose, CA (US)

(73) Assignee: III HOLDINGS 1, LLC, Wilmington, DE (US)

( * ) Notice: Subject to any disclaimer, the term of this patent is extended or adjusted under 35 U.S.C. 154(b) by 0 days.

(21) Appl. No.: 17/842,928

(22) Filed: Jun. 17, 2022

(65) Prior Publication Data

US 2022/0318474 A1 Oct. 6, 2022

Related U.S. Application Data

(60) Continuation of application No. 16/834,016, filed on Mar. 30, 2020, now Pat. No. 11,366,949, which is a continuation of application No. 14/619,701, filed on Feb. 11, 2015, now Pat. No. 10,606,973, which is a division of application No. 13/369,267, filed on Feb. 8, 2012, now abandoned.

(60) Provisional application No. 61/440,630, filed on Feb. 8, 2011.

(51) Int. Cl.
| | |
|---|---|
| *G06F 30/39* | (2020.01) |
| *H10B 61/00* | (2023.01) |
| *G11C 11/02* | (2006.01) |
| *G11C 11/16* | (2006.01) |

(52) U.S. Cl.
CPC ............. *G06F 30/39* (2020.01); *H10B 61/22* (2023.02); *G11C 11/02* (2013.01); *G11C 11/16* (2013.01)

(58) Field of Classification Search
CPC ...................................... H01L 27/228
See application file for complete search history.

(56) References Cited

U.S. PATENT DOCUMENTS

| | | | |
|---|---|---|---|
| 2002/0057593 A1* | 5/2002 | Hidaka | G11C 5/025 365/171 |
| 2002/0172073 A1 | 11/2002 | Hidaka | |
| 2007/0091679 A1 | 4/2007 | Asao | |
| 2007/0283298 A1 | 12/2007 | Berstein et al. | |
| 2008/0229269 A1 | 9/2008 | Lamorey | |
| 2010/0072530 A1 | 3/2010 | Takizawa | |
| 2011/0128771 A1 | 6/2011 | Rao | |
| 2011/0141796 A1 | 6/2011 | Lee et al. | |

* cited by examiner

*Primary Examiner* — Yu-Hsi D Sun
(74) *Attorney, Agent, or Firm* — Volpe Koenig

(57) ABSTRACT

Provided herein is a cell of a magnetic random access memory (MRAM) circuit. The cell includes a horizontal outer perimeter and an access transistor including a first terminal, a second terminal, and a gate terminal. The cell includes a magnetic tunnel junction (MTJ) structure located in the horizontal outer perimeter and above the bottom electrode. The MTJ structure being centered within the horizontal outer perimeter. The cell includes a bottom electrode located entirely within the horizontal outer perimeter. The bottom electrode comprising a shape enabling the MTJ structure to be centered within the horizontal outer perimeter.

13 Claims, 5 Drawing Sheets

MEMORY CELL LAYOUT FOR LOW CURRENT FIELD-INDUCED MRAM

PRIORITY

This application is a continuation of U.S. patent application Ser. No. 16/834,016, filed Mar. 30, 2020, which is a continuation of U.S. patent application Ser. No. 14/619,701, filed on Feb. 11, 2015, which is a division of U.S. patent application Ser. No. 13/369,267, filed Feb. 8, 2012, which claims the benefit of priority to U.S. Provisional Patent Application No. 61/440,630, filed Feb. 8, 2011, for which the entire specification and drawings of each application is incorporated here by reference.

FIELD

Embodiments of the invention relate to low power field-induced MRAM cell layouts for 65 nm, 45 nm and 32 nm CMOS nodes.

BACKGROUND

In a field-induced magnetic random access memory (MRAM) a current-induced magnetic field generated around metal lines is used to write data into memory cells. Each memory cell stores a bit of data in a magnetic tunnel junction (MTJ). The MTJ is located at the intersection of two conductors in the form of a bit line and a word line. Normally, these lines are laid out perpendicular to each other. To write binary data (a "0" or a "1") to a MTJ cell, enough current must flow simultaneously through the bit line and the word line associated with that particular cell for a certain amount of time. The sense in which the current flows in both metal lines sets the data value "0" or "1" in the cell.

In some embodiments of MRAM, data may be read from an MTJ through an access transistor connected to the MTJ, which forms part of the memory cell. This transistor is unique to the MTJ being addressed but parts of the transistor may be shared with transistors from neighboring cells.

SUMMARY

Embodiments of the present invention disclose an MRAM cell layout for 32 nm, 45 nm, and 65 nm CMOS process technology.

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form only in order to avoid obscuring the invention.

Reference in this specification to "one embodiment" or "an embodiment" means that a particular feature, structure, or characteristic described in connection with the embodiment is included in at least one embodiment of the invention. The appearance of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Although the following description contains many specifics for the purposes of illustration, anyone skilled in the art will appreciate that many variations and/or alterations to said details are within the scope of the present invention. Similarly, although many of the features of the present invention are described in terms of each other, or in conjunction with each other, one skilled in the art will appreciate that many of these features can be provided independently of other features. Accordingly, this description of the invention is set forth without any loss of generality to, and without imposing limitations upon, the invention.

Field-induced MRAM relies on a magnetic field generated around metal lines to switch the magnetization of a MTJ. In most embodiments each cell has two crossing metal lines for this purpose. These lines are the bit line and the word line, respectively. The MTJ is located at the intersection of these two lines and at least the bit line is in contact with the MTJ.

In some embodiments of MRAM, the memory cell also comprises an access transistor connected to the MTJ. The final cell size may be defined by the metal lines' pitch and/or by the access transistor size.

Embodiments of the present invention disclose different MRAM cell layouts, and MRAM structures (cell and devices) based on said cell layouts. Each MRAM cell layout is optimized for a given level of CMOS process technology.

Figure 1:
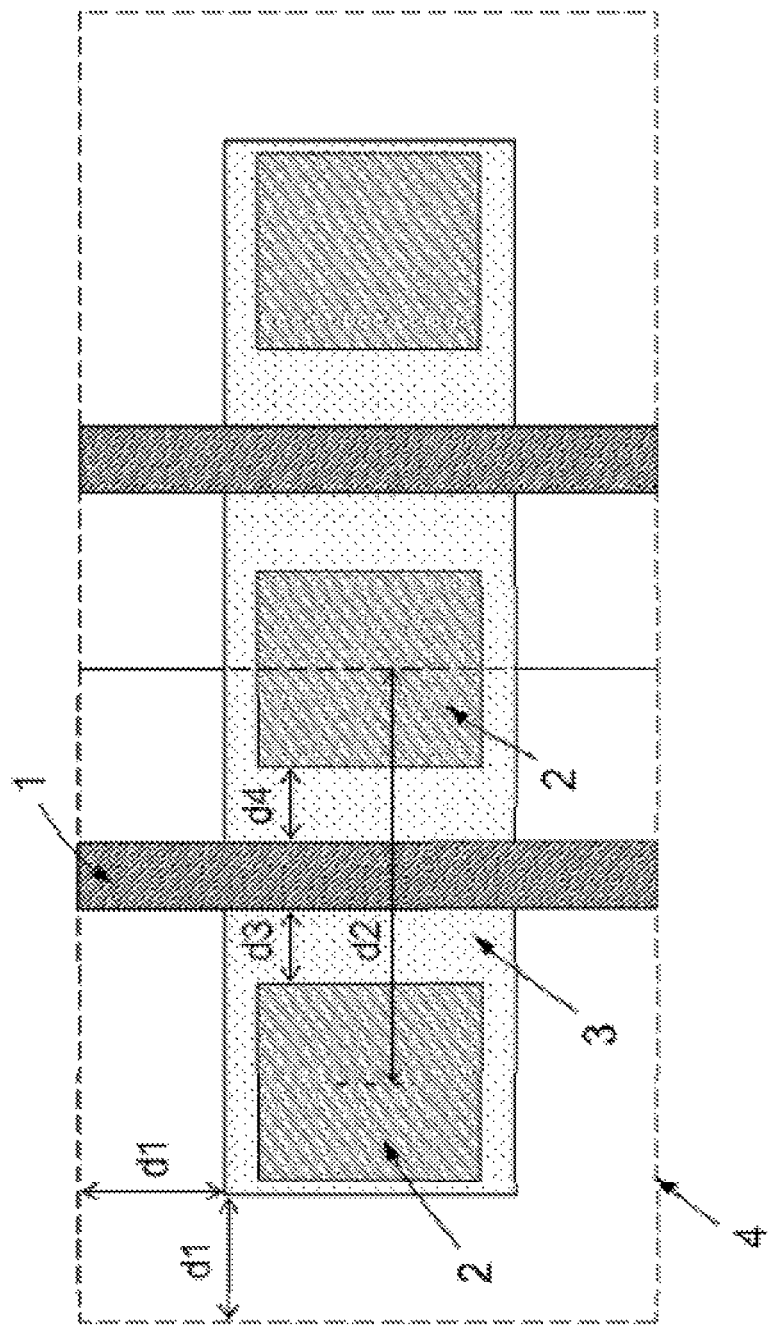
FIG. 1 is a schematic drawing showing Level 1 of a MRAM cell layout, in accordance with one embodiment of the invention.
Figure 2:
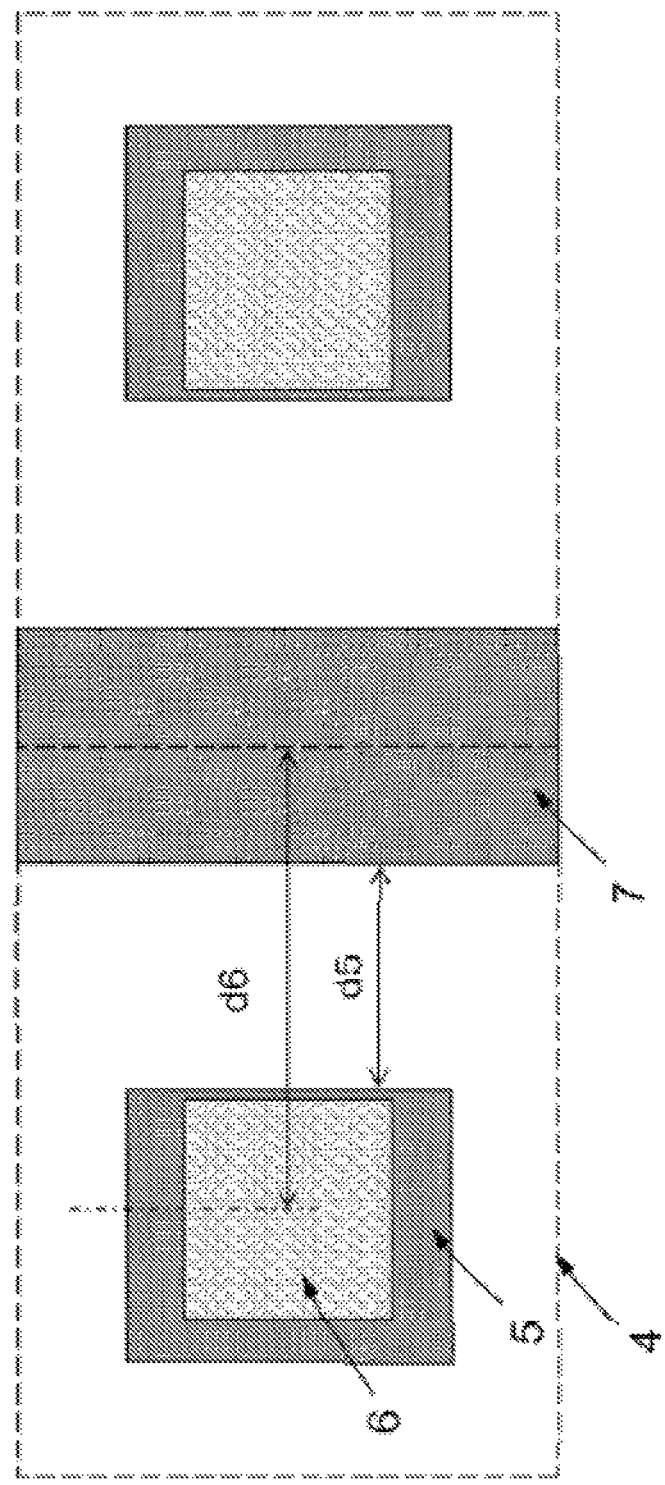
FIG. 2 is a schematic drawing showing Level 2 of the MRAM cell layout, in accordance with one embodiment of the invention.
Figure 3:
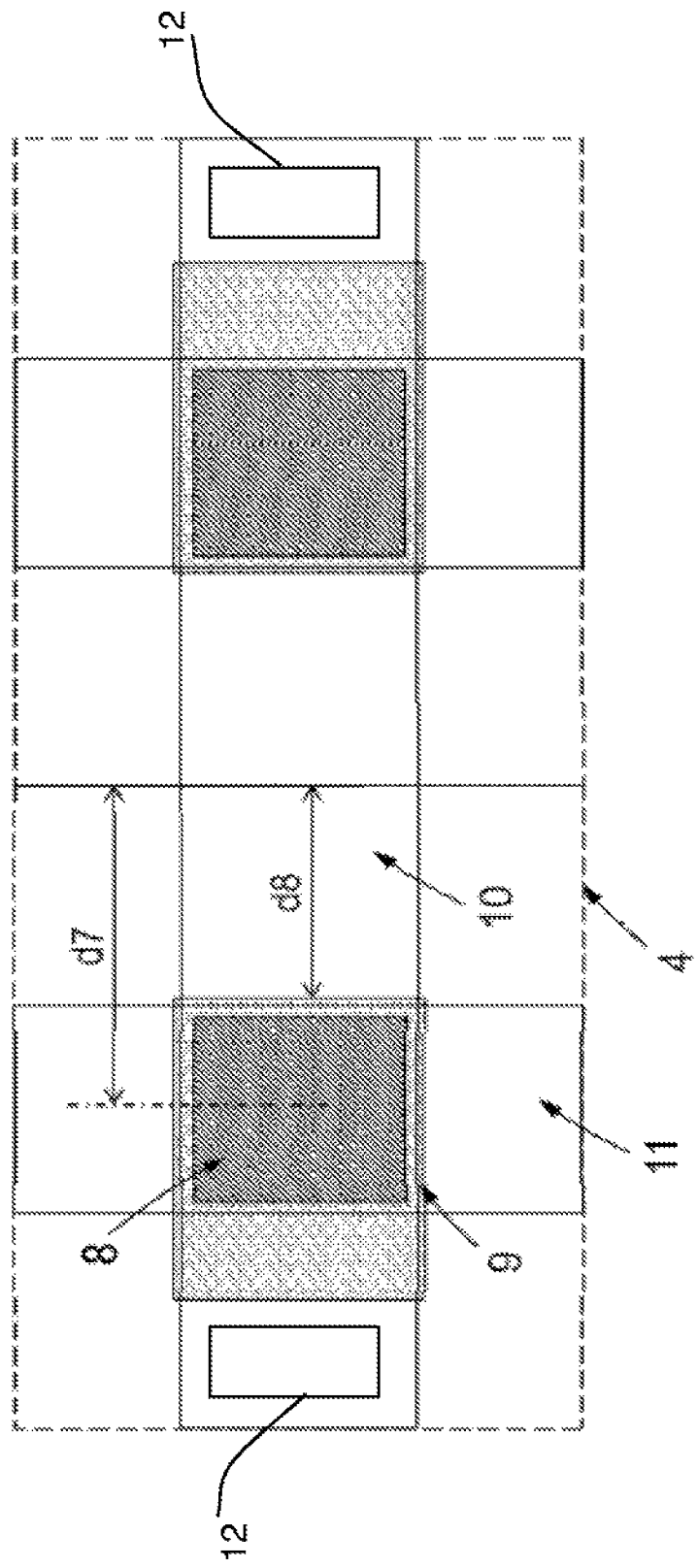
FIG. 3 is a schematic drawing showing Level 3 of the MRAM cell layout, in accordance with one embodiment of the invention.

For clarity, the MRAM cell layout is divided into three levels. FIG. 1 shows the first level, FIG. 2 shows the second level, and FIG. 3 shows the third level. In the figures, M1 refers to a first level of metallization, M2 a second level, and M3 a third level.

FIG. 1, shows the layout for two cells at the CMOS transistor level, in plan view. Referring to FIG. 1, reference numeral 1 refers to a gate formed between contacts 2. The gate may be of poly-silicon, in one embodiment. Reference numeral 3 indicates an active area for the MRAM cell. Reference numeral 4 indicates the cell border. Reference numeral 5 indicates a metal 1 (M1) island. Reference numeral 6 indicates a via, referred to as via 1 Reference numeral 7 indicates a metal 1 line. Reference numeral 8 indicates a MTJ. Reference numeral 9 indicates a bottom electrode. Reference numerals 10 and 11 indicate a metal 2 line and a metal 3 line, respectively. The via 1 connects M2 and M1.

The second level depicted in FIG. 2 shows the MRAM cell layout from the M1 layer up to via 1, in plan view. Metal line 7 connecting the source is common for both transistors (left and right).

Referring to FIG. 3, the third level shows the magnetic region of the cell in plan view. The magnetic region includes layers: bottom electrode (9), MTJ (8), metal 2 (10) and metal 3 (11). The bottom electrode is also a seed layer for the MTJ—and connects the MTJ (8) to via 1 (6), which is the element connected to the access transistor through M2 (10) and Interface via (12). This electrode is shaped so that the MTJ (8) can be placed at the center of the cell, as shown in FIG. 3. In this way the magnetic interaction between neighboring cells is minimized, which is important to reduce variation in the switching field of the MTJ's.

Figure 4:
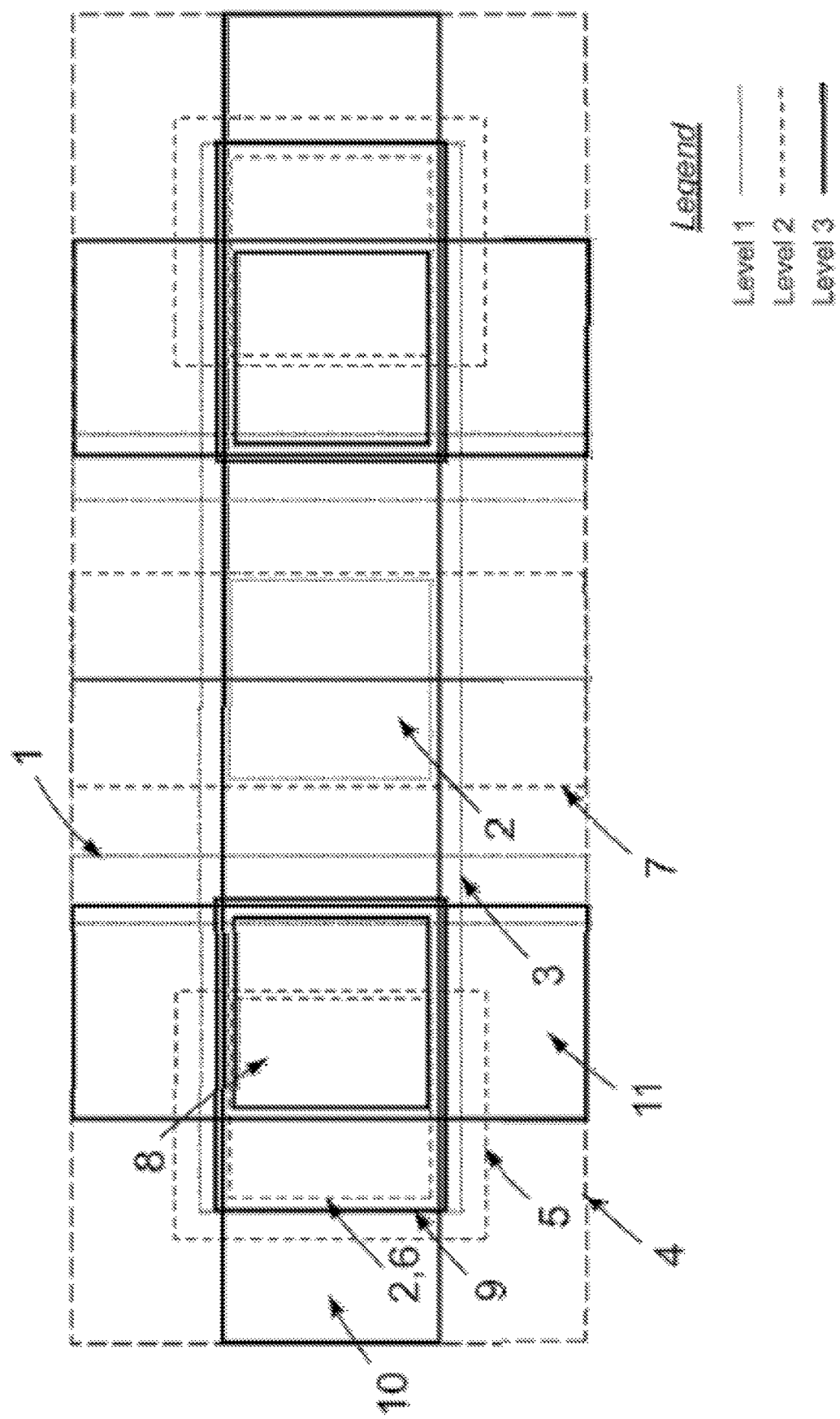
FIG. 4 is a schematic drawing showing a combination of Levels 1-3 of the MRAM cell layout.

FIG. 4 shows all levels of the cell combined.

Figure 5:
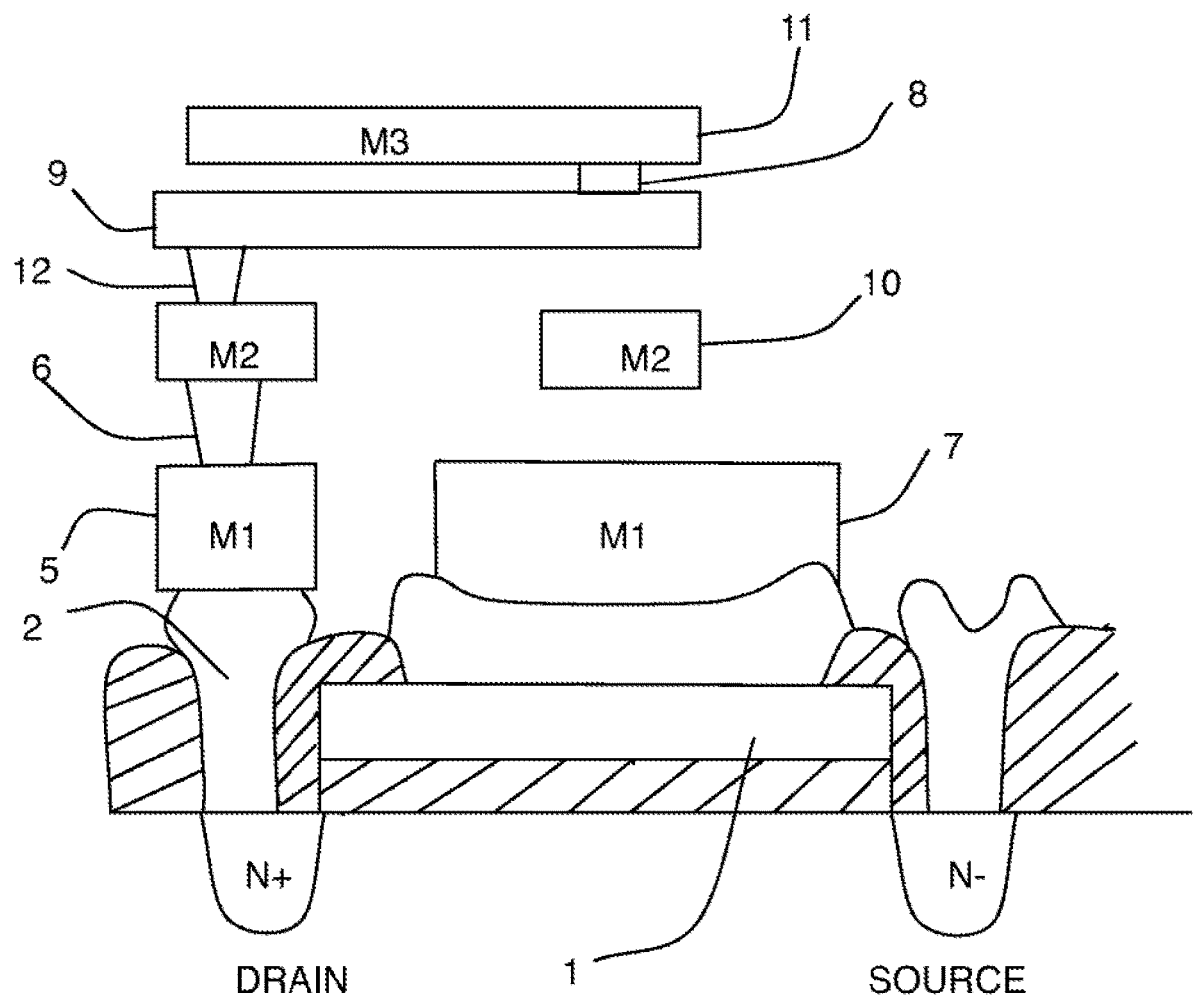
FIG. 5 is a schematic drawing of a MRAM cell based on a MRAM cell layout, in accordance with one embodiment of the invention.

FIG. 5 shows a side view of the MRAM cell, fabricated in accordance with the MRAM cell layout described above.

The final cell size depends on available CMOS manufacturing process capability. According to current manufacturing process a list of dimensions of the different elements of the cell and distances between some of those elements (as numbered in FIGS. 1 to 4) is provided in Table 1. The table covers MRAM cell layouts for CMOS nodes 65 nm, 45 nm and 32 nm.

TABLE 1

MRAM Cell Layout for 32 nm CMOS process technology

| Element | Description | Size (nm) 32 nm node cell |
|---|---|---|
| 1 | Poly-Si gate | 18 |
| 2 | Contact | 54 × 54 |
| 3 | Active area width | 70 |
| 4 | Cell border | 180 × 140 |
| 5 | Metal 1 island | 67 × 84 |
| 6 | Via 1 | 54 × 54 |
| 7 | Metal 1 line | 58 |
| 8 | MTJ | 46 × 46 |
| 9 | Bottom electrode | 95 × 66 |
| 10 | Metal 2 line | 58 |
| 12 | Interface via | 54 × 54 |
| 11 | Metal 3 line | 58 |
| d1 | | 35 |
| d2 | | 114 |
| d3 | | 21 |
| d4 | | 21 |
| d5 | | 56 |
| d6 | | 114 |
| d7 | | 90 |
| d8 | | 57 |

TABLE 2

MRAM Cell Layout for 45 nm CMOS process technology Size (nm) Element

| Element | Description | Size (nm) 45 nm node cell |
|---|---|---|
| 1 | Poly-Si gate | 25 |
| 2 | Contact | 70 × 70 |
| 3 | Active area width | 80 |
| 4 | Cell border | 250 × 160 |
| 5 | Metal 1 island | 90 × 80 |
| 6 | Via 1 | 70 × 70 |
| 7 | Metal 1 line | 80 |
| 8 | MTJ | 65 × 65 |
| 9 | Bottom electrode | 125 × 80 |
| 10 | Metal 2 line | 80 |
| 12 | Interface via | 70 × 70 |
| 11 | Metal 3 line | 80 |
| d1 | | 40 |
| d2 | | 160 |
| d3 | | 35 |
| d4 | | 30 |

TABLE 2-continued

MRAM Cell Layout for 45 nm CMOS process technology Size (nm) Element

| Element | Description | Size (nm) 45 nm node cell |
|---|---|---|
| d5 | | 80 |
| d6 | | 160 |
| d7 | | 125 |
| d8 | | 85 |

TABLE 3

MRAM Cell Layout for 65 nm CMOS process technology Size (nm) Element

| Element | Description | Size (nm) 65 nm mode cell |
|---|---|---|
| 1 | Poly-Si gate | 35 |
| 2 | Contact | 100 × 100 |
| 3 | Active area width | 110 |
| 4 | Cell border | 350 × 220 |
| 5 | Metal 1 island | 130 × 110 |
| 6 | Via 1 | 100 × 100 |
| 7 | Metal 1 line | 110 |
| 8 | MTJ | 100 × 100 |
| 9 | Bottom electrode | 195 × 130 |
| 10 | Metal 2 line | 120 |
| 12 | Interface via | 100 × 100 |
| 11 | Metal 3 line | 120 |
| d1 | | 55 |
| d2 | | 235 |
| d3 | | 50 |
| d4 | | 50 |
| d5 | | 110 |
| d6 | | 230 |
| d7 | | 175 |
| d8 | | 110 |

In one embodiment, the MRAM cell layouts specified above may be stored in a format that supports data exchange of integrated circuit layouts. For example, the MRAM cell layouts may be stored in a Graphic. Database System (GDS) format such as in GDSII format stored a computer-readable medium. Examples of computer-readable media include but are not limited to recordable type media such as volatile and non-volatile memory devices, floppy and other removable disks, hard disk drives, optical disks (e.g., Compact Disk Read-Only Memory (CD ROMS), Digital Versatile Disks, (DVDs), etc.).

Although the present invention has been described with reference to specific example embodiments, it will be evident that various modifications and changes can be made to these embodiments without departing from the broader spirit of the invention.

The invention claimed is:

1. A cell of a magnetic random access memory (MRAM) circuit comprising:
    a horizontal outer perimeter;
    an access transistor including a first terminal, a second terminal, and a gate terminal;
    a magnetic tunnel junction (MTJ) structure located in the horizontal outer perimeter and above electrode, the MTJ structure being centered within the horizontal outer perimeter; and
    a bottom electrode located entirely within the horizontal outer perimeter, the bottom electrode configured as a seed layer for the MTJ structure that connects the MTJ structure to a via and comprising a shape enabling the MTJ structure to be centered within the horizontal outer perimeter, wherein the cell is configured at a distance equal to a length of the horizontal outer perimeter from one or more neighboring cells of the MRAM circuit to minimize magnetic interactions between and to reduce variation in switching fields of the MJT structure of the cell and MJT structures of the one or more neighboring cells of the MRAM circuit.

2. The cell of the MRAM circuit of claim 1, wherein the MTJ structure being centered within the horizontal outer perimeter reduces a variation in a switching field of the MTJ structure.

3. The cell of the MRAM circuit of claim 1, wherein a size of the MTJ when the MRAM circuit is fabricated is equal to or greater than 45 nm by 45 nm.

4. The cell of the MRAM circuit of claim 1, wherein the shape of the bottom electrode comprises a length spanning from a location of an interface via to a horizontal plane center.

5. The cell of the MRAM circuit of claim 4, wherein the location of the interface via being closer to the horizontal outer perimeter than to the horizontal plane center.

6. The cell of the MRAM circuit of claim 1, wherein a size of the MRAM circuit comprises the horizontal outer perimeter being equal to or greater than 180 nm by 140 nm.

7. The cell of the MRAM circuit of claim 1, wherein a size of the MRAM circuit comprises the horizontal outer perimeter being a length to width ratio equal to or greater than 0.6.

8. The cell of the MRAM circuit of claim 1, wherein a ratio of a length of the bottom electrode along an axis to a length of the MTJ structure along the same axis is equal to or greater than 1.9.

9. The cell of the MRAM circuit of claim 8, wherein the ratio is 2.1 when the MRAM circuit is fabricated at a 32 nm complementary metal-oxide semiconductor (CMOS) process technology.

10. The cell of the MRAM circuit of claim 8, wherein the ratio is 1.9 when the MRAM circuit is fabricated at a 45 nm CMOS process technology.

11. The cell of the MRAM circuit of claim 8, wherein the ratio is 2.0 when the MRAM circuit is fabricated at a 65 nm CMOS process technology.

12. The cell of the MRAM circuit of claim 1, wherein a cell size of the horizontal outer perimeter is defined by a pitch of one or more metal lines and by a size of the access transistor.

13. The cell of the MRAM circuit of claim 1, wherein a first dimension of the horizontal outer perimeter comprises a value along a range of one hundred fourteen (114) nanometers (nm) to two hundred twenty (220) nanometers (nm).

* * * * *